United States Patent
Segawa et al.

(10) Patent No.: US 7,148,545 B2
(45) Date of Patent: Dec. 12, 2006

(54) SEMICONDUCTOR DEVICE WITH ISOLATED STORAGE CAPACITOR AND ITS MANUFACTURING METHOD

(75) Inventors: Yasuo Segawa, Gifu (JP); Masaaki Aota, Ogaki (JP); Tsutomu Yamada, Mizuho (JP)

(73) Assignee: Sanyo Electric Co., Ltd., Osaka (JP)

( * ) Notice: Subject to any disclaimer, the term of this patent is extended or adjusted under 35 U.S.C. 154(b) by 14 days.

(21) Appl. No.: 10/705,223

(22) Filed: Nov. 12, 2003

(65) Prior Publication Data
US 2004/0155242 A1 Aug. 12, 2004

(30) Foreign Application Priority Data
Nov. 11, 2002  (JP) ..................... 2002-326412

(51) Int. Cl.
*H01L 27/12* (2006.01)

(52) U.S. Cl. ............... 257/368; 257/213; 257/288; 257/347; 257/E27.112

(58) Field of Classification Search ............. 438/151, 438/149, 152, 153, 154, 156, 169, 305, 311, 438/298, 282, 412, 517, 910, 479, 175; 257/347, 257/348, 349, 350, 351, 352, 353, 354; 349/33, 349/38, 39
See application file for complete search history.

(56) References Cited
U.S. PATENT DOCUMENTS 5,880,991 A * 3/1999 Hsu et al.
6,055,460 A * 4/2000 Shopbell
6,181,398 B1 * 1/2001 Libsch et al.
6,187,684 B1 * 2/2001 Farber et al.
6,599,785 B1 * 7/2003 Hamada et al.
6,812,912 B1 11/2004 Miyajima et al.

FOREIGN PATENT DOCUMENTS

| JP | 06-230420 | * 8/1994 |
| JP | 2002-43578 | 2/2002 |
| JP | 2002-296619 | 10/2002 |
| KR | 2000-14518 | 3/2000 |
| KR | 2002-0070878 | 9/2002 |

* cited by examiner

Primary Examiner—Nathan J. Flynn
Assistant Examiner—Kevin Quinto
(74) Attorney, Agent, or Firm—Morrison & Foerster LLP

(57) ABSTRACT

A first semiconductor layer that makes a capacitance coupling with a gate electrode of a thin film transistor through a gate insulating layer and a second semiconductor layer that makes a capacitance coupling with a storage capacitor line of a storage capacitor through the gate insulating layer are formed separately. Also, the first semiconductor layer and the second semiconductor layer are connected by a metal wiring. The gate electrode of the thin film transistor makes capacitance coupling with the first semiconductor layer and the storage capacitor line of the storage capacitor makes capacitance coupling with the second semiconductor layer independently. Voltage are induced in the first semiconductor layer and the second semiconductor layer independently. Since there will be no big discrepancy in voltage in the gate insulating layer, the dielectric break down and the leakage can be prevented.

8 Claims, 7 Drawing Sheets

SEMICONDUCTOR DEVICE WITH ISOLATED STORAGE CAPACITOR AND ITS MANUFACTURING METHOD

BACKGROUND OF THE INVENTION

1. Field of the Invention

This invention relates to a semiconductor device that has a thin film transistor formed on a substrate and a storage capacitor formed adjacent to the thin film transistor for holding voltage supplied through the thin film transistor. This invention also relates to a manufacturing method of the semiconductor device.

2. Description of the Related Art

FIG. 4 is a diagram of a conventional liquid crystal display device. A liquid crystal panel 150 has a plurality of pixels formed in a matrix configuration with n-rows and m-columns. Each of the pixels has a pixel selection thin film transistor (referred to as the TFT, hereinafter) 10, a liquid crystal LC, and a storage capacitor Csc.

A gate line 20 extending in a row direction is connected to the gate of the TFT 10, and a data line 22 extending in a column direction is connected to the drain of the TFT 10. A gate scanning signal is sequentially supplied from a vertical driving circuit 130 to the gate line 20 of each row and the TFT 10 is selected accordingly. Also, a video signal is applied to the liquid crystal LC through the TFT 10 based on a drain scanning signal supplied from a horizontal driving circuit 140. The storage capacitor Csc is used for holding the video signal supplied through the TFT 10.

FIG. 5 is a plan view of the pixel described above. FIG. 6 is a cross-sectional view of the pixel along with the Y—Y line in FIG. 5. Also, FIG. 5 is a plan view looking from the backside of a first substrate 100. The liquid crystal display device has the first substrate 100 made of a transparent insulating material such as glass, a second substrate 500, and a liquid crystal 200 inserted between the two substrates.

A semiconductor layer 14 (for example, a poly-silicon layer) of the TFT 10 is bent and intersects the gate line 20 straightly extending in a row direction at two points in the pixel. A channel region 14c is formed at each location where the semiconductor layer and the gate line cross each other. The gate line 20 has a double gate configuration.

A gate insulating layer 66 is formed between a gate electrode which is a part of the gate line 20 and the channel region 14c. A drain region 14d of the semiconductor layer 14 is connected to the data line 22 extending in a column direction through a contact hole C0 formed in an interlayer insulating film 68 and the gate insulating layer 66.

A source region 14s of the semiconductor layer 14 is connected to a metal wiring 40 through a contact hole C1 formed in the interlayer insulating film 68 and the gate insulating layer 66. The metal wiring 40 is formed in the same layer (for example, an aluminum layer) as the data line 22 and disposed on the interlayer insulating film 68. The metal wiring 40 is also connected to a pixel electrode 24 located in an upper layer through a planarization insulating film 72 disposed above the metal wiring 40.

Also, the storage capacitor line 42 is formed in the same layer (for example, molybdenum film, chrome film) as that of the gate line 20. The storage capacitor line 42 extends straightly in the row direction and is formed above a part of the semiconductor layer 14 with the gate insulating layer 66 between the storage capacitor line 42 and the semiconductor layer 14. The area where both the capacitor line 42 and the semiconductor layer 14 are configured to operate as a storage capacitor Csc.

Japanese Patent Application Publication No. Hei 1-129234 discloses the liquid crystal display device described above.

However, the gate insulating layer 66 located beneath the gate electrode of the TFT 10 sometimes suffers from the dielectric break down or the leakage during the manufacturing process. The cause of this kind of trouble will be explained below.

FIG. 7 shows the cross-sectional view of the manufacturing process of the liquid crystal display device and corresponds to the cross-section along with the Y—Y line in FIG. 5. A dry etching method is employed for processing the gate line 20 and the storage capacitor line 42. Static charge is stored in the gate line 20 and the storage capacitor line 42 during this process. When the ion implantation of an N-type impurity, such as arsenic or phosphorus, into the semiconductor layer 14 is performed for forming the source region 14s and the drain region 14d using the gate line 20 as a mask, static charge is also stored in the gate line 20 and the storage capacitor line 42 due to charging-up phenomena. The gate line 20 and the storage capacitor line 42 tend to store static charge easily because they extend across the liquid crystal panel 100.

Therefore, the voltage induced at the gate line 20 and the storage capacitor line 42 increases, having the voltage of the semiconductor layer 14, which makes a capacitance coupling with the two lines, increase. With this condition, the storage capacitor line 42, for example, discharges stored charges. This electric discharge tends to occur between the storage capacitor line 42 and the pattern of the vertical driving circuit 130 that is located near the storage capacitor line 42. Then, the voltage of the storage capacitor line 42 drastically decreases, having the voltage of the semiconductor layer 14, which makes a capacitance coupling with the line, also drastically decrease. Therefore, there will be a big discrepancy in voltage in the gate insulating layer 66 between the gate line 20 and the semiconductor layer 14, causing the dielectric breakdown or the leakage at the location A shown in FIG. 7. This type of trouble causes a line defect and point defect when the completed liquid crystal display device forms a display image.

SUMMARY OF THE INVENTION

The invention provide a semiconductor device that includes a substrate, a thin film transistor disposed on the substrate, a storage capacitor disposed adjacent the thin film transistor and keeping a voltage supplied through the thin film transistor, a first semiconductor portion making a first capacitance coupling with a gate electrode of the thin film transistor, and a second semiconductor portion making a second capacitance coupling with a storage capacitor electrode of the storage capacitor. The second semiconductor portion is not in a physical contact with the first semiconductor portion. The device also includes a metal wiring connecting the first semiconductor portion and the second semiconductor portion.

The invention also provides a manufacturing method of a semiconductor device. The method includes providing a substrate, forming a first semiconductor portion and a second semiconductor portion on the substrate so that the first semiconductor portion is physically separated from the second semiconductor portion, forming an insulating film on the first semiconductor portion and the second semiconductor portion, forming a gate electrode on the insulating film so that the gate electrode and the first semiconductor portion are part of a thin film transistor, forming a storage capacitor electrode on the insulating film so that the storage capacitor electrode and the second semiconductor portion are part of a storage capacitor, forming a source region and a drain region in the first semiconductor layer, and forming a metal wiring connecting the first semiconductor portion and the second conductor portion.

DETAILED DESCRIPTION OF THE INVENTION

Figure 1:
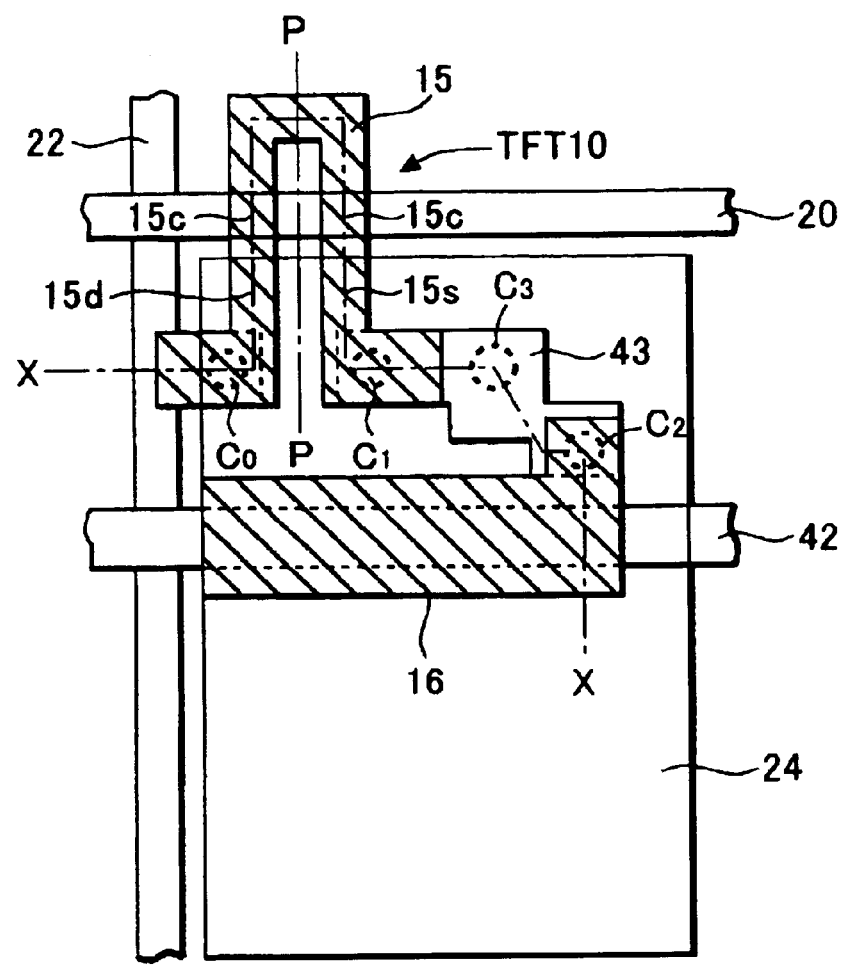
FIG. 1 is a plan view of one pixel of a liquid crystal display device of an embodiment of this invention.
Figure 2:
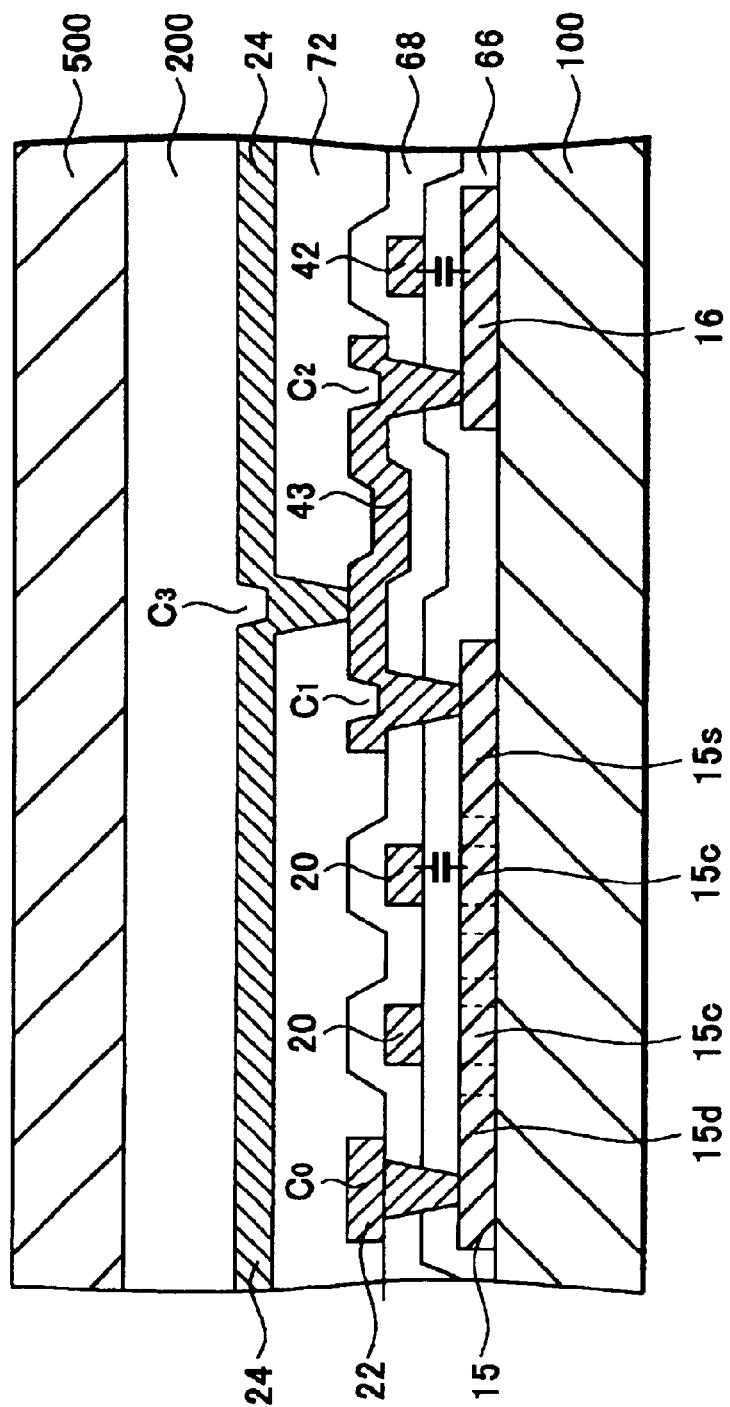
FIG. 2 is a cross-sectional view of the device shown in FIG. 1 along X—X line in FIG. 1.
Figure 4:
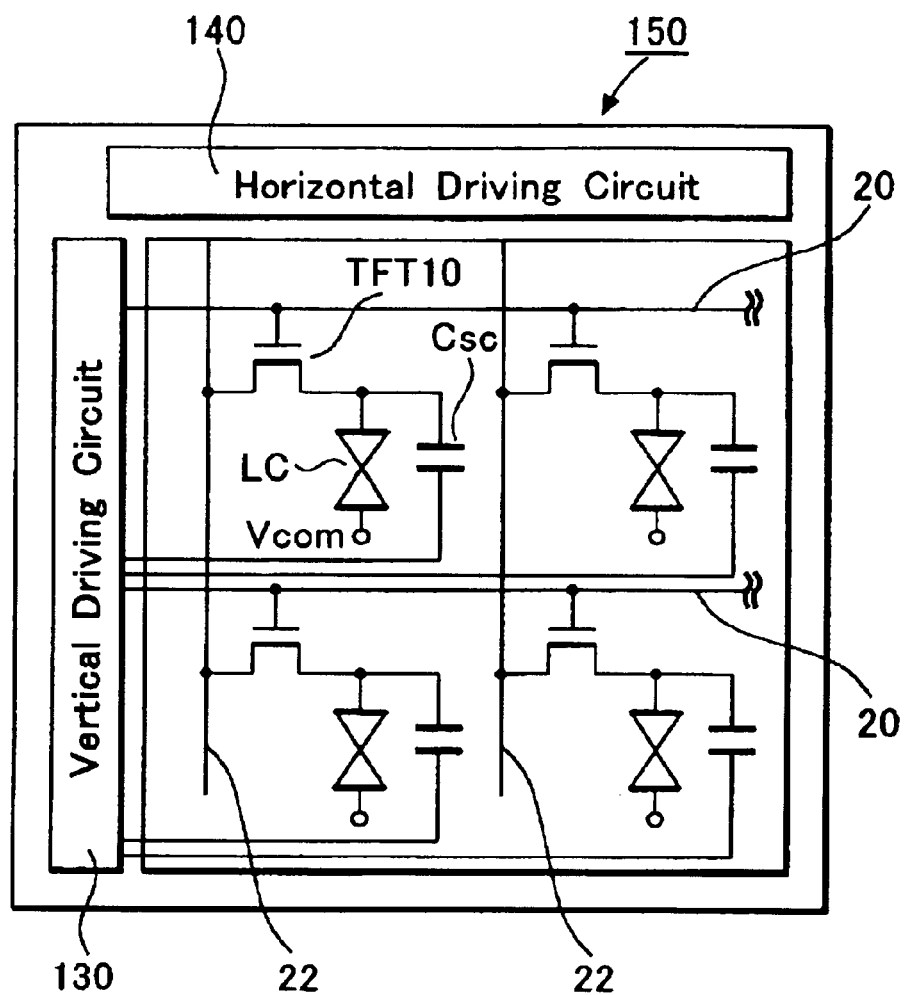
FIG. 4 is a circuit diagram of a conventional liquid crystal display device.
Figure 5:
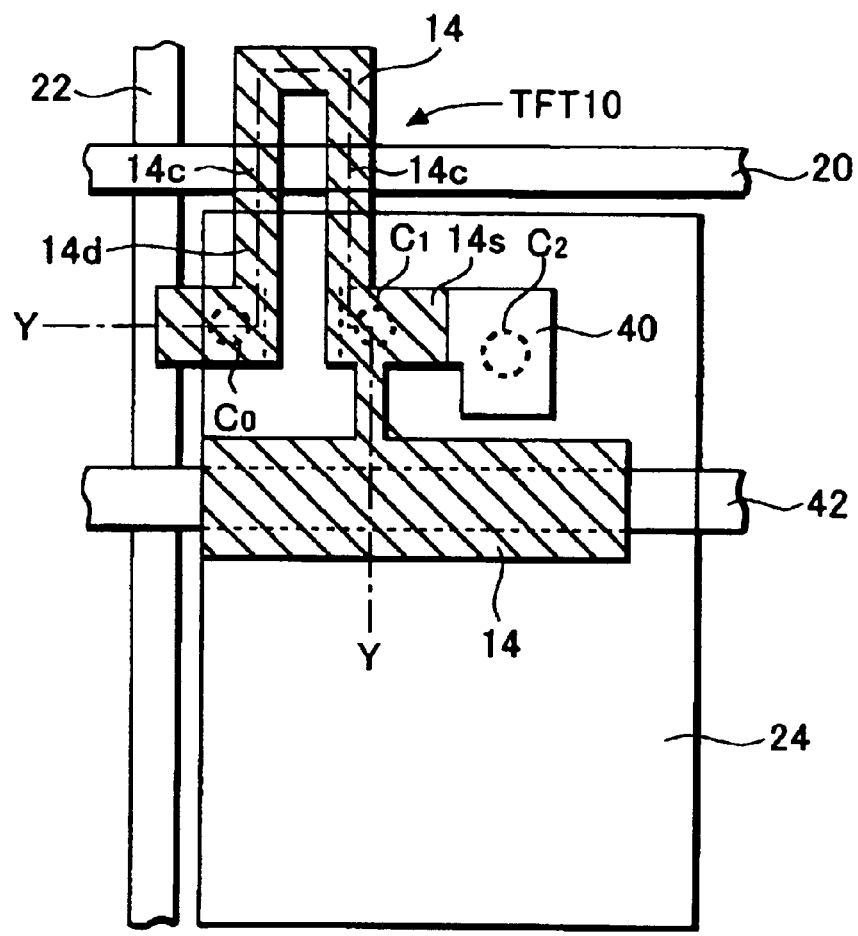
FIG. 5 is a plan view of one pixel of the conventional liquid crystal display device of Fog. 4.
Figure 6:
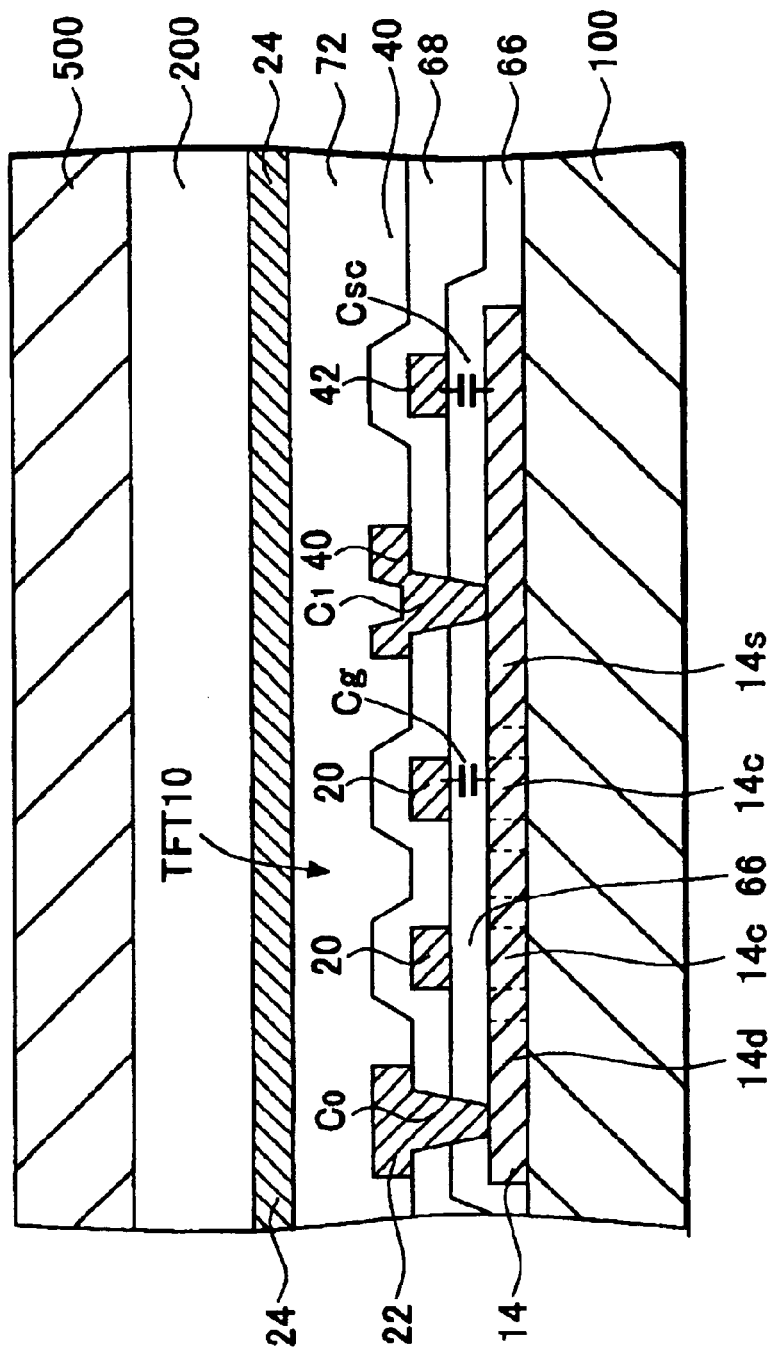
FIG. 6 is a cross-sectional view of the device of FIG. 5 along Y—Y line in FIG. 5.
Figure 7:
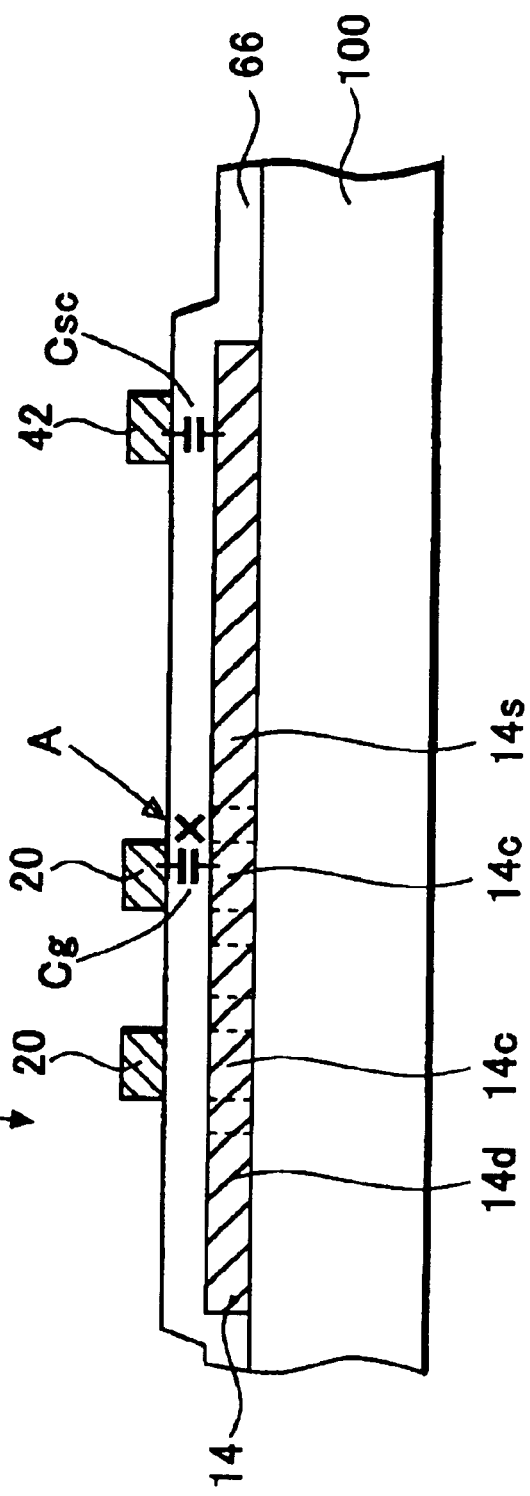
FIG. 7 is a cross-sectional view of a device intermediate during a manufacturing of the conventional liquid crystal display device of FIG. 5.

A liquid crystal display device of an embodiment of this invention has a configuration similar to that of the display device shown in FIG. 4. FIG. 1 shows a plan view of one pixel of the liquid crystal display device of this embodiment. FIG. 2 is a cross-section view along X—X line in FIG. 1. FIG. 1 is a plan view looking from the backside of a first substrate 100. The same components as those shown in FIGS. 5 and 6 have the same reference numerals, and the explanation on those components will be omitted.

A first semiconductor layer 15 (for example, poly-silicon layer) of a TFT 10 is bent to intersect a gate line 20, which straightly extends in a row direction, at two locations. Channel regions 15c are formed in the first semiconductor layer 15 at the location where it intersects the gate line. The gate line has a double gate configuration. The first semiconductor layer 15 is bent to form symmetrical configuration with respect to the P—P line in FIG. 1.

A gate insulating film 66 is formed between the gate electrode which is a part of the gate line 20 and the channel region 15c. A drain region 15d of the first semiconductor layer 15 is connected to a data line 22, which extends in a column direction, through a contact hole C0 formed in an interlayer insulating film 68 and the gate insulating film 66.

A source region 15s of the TFT 10 is connected to a metal wiring 43 through a contact hole C1 formed in the interlayer insulating film 68 and the gate insulating film 66. The metal wiring 43 is formed in the same layer (for example, an aluminum layer) as the data line 22 and disposed on the interlayer insulating film 68. The metal wiring 43 is also connected to a pixel electrode 24 located in an upper layer through a contact hole C3 formed in a planarization insulating film 72 disposed above the metal wiring 43.

Also, the storage capacitor line 42 is configured from the same layer (for example, molybdenum film, chrome film) as that of the gate line 20. The storage capacitor line 42 extends straightly in a row direction. The storage capacitor line 42 is disposed in the same area as that of a second semiconductor layer 16, which is formed independently from the first semiconductor layer 15, with the gate insulating layer 66 between the storage capacitor line 42 and the second semiconductor layer 16. The area where both the capacitor line 42 and the second semiconductor layer 16 are configured to operate as the storage capacitor Csc.

The second semiconductor layer 16 is connected to the metal wiring 43 through a contact hole C2 formed in the interlayer insulating film 68 and the gate insulating film 66. That is, the first and the second semiconductor layers are separate units, but connected to each other by the metal wiring 43.

Figure 3:
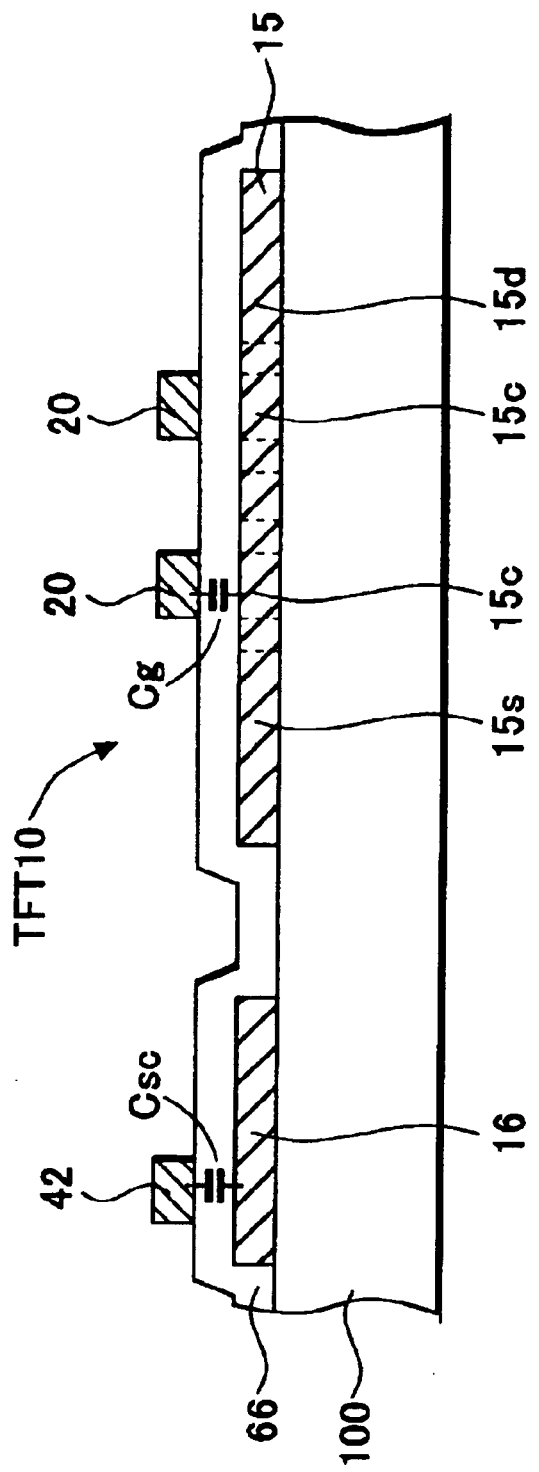
FIG. 3 is a cross-sectional view of a device intermediate during a manufacturing of the liquid crystal display device of FIG. 1.

FIG. 3 is a cross-sectional view showing the manufacturing process of the liquid crystal display device. This figure corresponds to the cross-sectional view along X—X line in FIG. 1. The manufacturing method of the liquid crystal display device of this invention will be explained by referring to FIGS. 1–3.

The first semiconductor layer 15 and the second semiconductor layer 16, which are separate from each other, are formed on a first substrate 100. This step is achieved by the forming of an amorphous silicon layer on the first substrate 100, the poly-crystallization of the silicon layer through leaser anneal method, and patterning of the layer afterwards.

The gate insulating film 66 made of $SiO_2$ is disposed through CVD method on the first semiconductor layer 15 and the second semiconductor layer 16. Then, the gate line 20 is formed on the first semiconductor layer 15 with the gate insulating layer 66 between them. The storage capacitor line 42 is formed on the second semiconductor line 16 with the gate insulating layer 66 between them. In this process, the gate line 20 and the storage capacitor line 42 are formed by depositing molybdenum or a chrome and then performing dry etching on the disposed film.

Next, ion implantation is performed to form the source region 15s and the drain region 15d in the first semiconductor layer 15. If the LDD configuration is desired, the following processes should be taken. First, the source region and the drain region with a low impurity concentration are formed through ion implantation using the gate electrode as a mask. Then, a sidewall spacer is formed at the side of the gate electrode. The source region and the drain region with a high impurity concentration are formed through ion implantation using the gate electrode and its sidewall spacer as masks.

During the dry etching and the ion implantation processes described above, static charge is stored in the gate line 20 as well as the storage capacitor line 42. However, the gate electrode of the TFT 10 will make a capacitance coupling with the first semiconductor layer 15, and the storage capacitor line 42 of the storage capacitor Csc will make a capacitance coupling with the second semiconductor layer 16 respectively. The voltage of each semiconductor layer changes according to its respective capacitance coupling. Therefore, there will be no big discrepancy in the voltage in the gate insulating layer 66, preventing the dielectric break down or the leakage of the gate insulating film 66.

For example, when the voltage of the gate line 20 and the storage capacitor line 42 increases due to the static charge, the voltage of the first semiconductor layer 15 and the second semiconductor layer 16, which make a capacitance coupling with the two lines, also increases. Suppose the storage capacitor line 42, for example, discharges stored charges with this condition. Then, the voltage of the storage capacitor line 42 drastically decreases, having the voltage of the second semiconductor layer 16, which makes a capacitance coupling with the line, also drastically decrease.

However, since the first semiconductor layer 15 is separated from the second semiconductor layer 16, the voltage of the first semiconductor layer 15 will not go down. Therefore, there will be no big discrepancy in the voltage in the gate insulating film 66, preventing the dielectric break down and the leakage.

Next, the interlayer insulating film 68 is disposed on the entire surface. A first contact hole C1 and a second contact hole C2 are formed at the location above the first semiconductor layer 15 and the second semiconductor layer 16, respectively. Then, the metal wiring 43 connecting the first semiconductor layer 15 and the second semiconductor layer 16 through the contact holes is disposed.

Furthermore, the planarization insulating film 72 is disposed on the entire surface. Then, a third contact hole C3 is formed at the location above the metal wiring 43. Then, the pixel electrode 24, which is connected to the metal wiring 43 through the third contact hole C3, is disposed. Also, during the forming processes of the interlayer insulating film 68 as well as the contact hole, static charge is stored in the gate line 20 and the storage capacitor line 42. However, the dielectric break down of and the leakage from the gate insulating film 66 will be prevented by the same mechanism explained above.

The first semiconductor layer 15 is bent to make a symmetrical configuration with respect to the P—P line in FIG. 1, as mentioned above, in order to balance the storage of static charge. This configuration effectively prevents the dielectric break down of the gate insulating film 66.

The processes that are vulnerable to the dielectric break down of the gate insulating film 66 due to static charge are the processes from the forming of the gate electrode to the forming of the contact hole. Specifically, the vulnerable processes include the forming of the gate electrode 20, the ion implantation, the forming of the interlayer insulating film, and the forming of the contact hole. This embodiment is very effective as a countermeasure against the problem caused by static charge.

The explanation has been made by using the liquid crystal display device as an example in this embodiment. However, this invention is not limited to this application. It can be broadly applied to the semiconductor device with a thin film transistor and a storage capacitor for keeping the voltage supplied through the thin film transistor. For example, this invention can be applied to an organic EL display device with a driver thin film transistor and a storage capacitor.

The gate electrode of the thin film transistor will make a capacitance coupling with the first semiconductor layer, and the storage capacitor electrode of the storage capacitor will make a capacitance coupling with the second semiconductor layer respectively, in this embodiment. The voltage of each semiconductor layer changes according to its capacitance coupling. Therefore, there will be no big discrepancy in the voltage in the gate insulating layer, preventing the dielectric break down or the leakage.

What is claimed is:

1. A semiconductor device comprising:
    a substrate;
    a thin film transistor disposed on the substrate;
    a storage capacitor disposed adjacent the thin film transistor and keeping a voltage supplied through the thin film transistor;
    a first semiconductor portion making a first capacitance coupling with a gate electrode of the thin film transistor;
    a second semiconductor portion making a second capacitance coupling with a storage capacitor electrode of the storage capacitor, the second semiconductor portion not being in a physical contact with the first semiconductor portion;
    a metal wiring connecting the first semiconductor portion and the second semiconductor portion; and
    a pixel electrode connected to the metal wiring,
    wherein the second semiconductor portion is disposed between the substrate and the storage capacitor electrode.

2. The semiconductor device of claim 1, wherein the storage capacitor electrode is disposed parallel to the gate electrode.

3. The semiconductor device of claim 1, wherein the thin film transistor comprises a p-type channel or an n-type channel.

4. The semiconductor device of claim 1, wherein the first and second conductor portions are formed from a semiconductor layer disposed on the substrate.

5. The semiconductor device of claim 1, wherein the first semiconductor portion is bent so that the first semiconductor portion intersects a gate line that comprises the gate electrode.

6. The semiconductor device of claim 5, wherein the bending of the first semiconductor portion is symmetrical with respect to a center line that is normal to the gate line.

7. A manufacturing method of a semiconductor device, comprising:
    providing a substrate;
    forming a first semiconductor portion and a second semiconductor portion on the substrate so that the first semiconductor portion is physically separated from the second semiconductor portion;
    forming an insulating film on the first semiconductor portion and the second semiconductor portion;
    forming a gate electrode on the insulating film so that the gate electrode and the first semiconductor portion are part of a thin film transistor;
    forming a storage capacitor electrode on the insulating film so that the storage capacitor electrode and the second semiconductor portion are part of a storage capacitor;
    forming a source region and a drain region in the first semiconductor layer;
    forming a metal wiring connecting the first semiconductor portion and the second conductor portion;
    forming an interlayer insulating film over the first and second semiconductor portions;
    forming a first contact hole in the interlayer insulating film so as to provide a contact to the first semiconductor portion;
    forming a second contact hole in the interlayer insulating film so as to provide a contact to the second semiconductor portion;
    forming a planarization insulating film over the metal wiring;
    forming a third contact in the planarization insulating film to provide a contact to the metal wiring; and
    forming a pixel electrode connected to the metal wiring through the third contact hole.

8. The manufacturing method of the semiconductor device of claim 7, wherein the source and drain regions are formed by ion implantation.

* * * * *